United States Patent [19]

Hsu et al.

[11] Patent Number: 4,927,777
[45] Date of Patent: May 22, 1990

[54] METHOD OF MAKING A MOS TRANSISTOR

[75] Inventors: Sheng T. Hsu, Lawrenceville; Doris W. Flatley, Belle Mead, both of N.J.

[73] Assignee: Harris Corporation, Melbourne, Fla.

[21] Appl. No.: 418,762

[22] Filed: Oct. 6, 1989

Related U.S. Application Data

[62] Division of Ser. No. 301,074, Jan. 24, 1989, abandoned.

[51] Int. Cl.$^5$ .......................................... H01L 21/265
[52] U.S. Cl. ........................................ 437/44; 437/34; 437/41; 437/57; 437/28; 437/233; 437/186; 437/192; 437/200; 357/23.3
[58] Field of Search ................. 437/41, 44, 34, 56, 437/57, 27, 28, 186, 192, 200, 193, 233, 235, 238; 357/23.3, 23.9, 23.11; 148/DIG. 117

[56] References Cited

U.S. PATENT DOCUMENTS

| 4,366,613 | 1/1983 | Ogura et al. | 437/45 |
| 4,419,809 | 12/1983 | Riseman et al. | 437/41 |
| 4,503,601 | 3/1985 | Chiao | 437/44 |
| 4,514,897 | 5/1985 | Chiu et al. | 437/44 |
| 4,616,399 | 10/1986 | Ooka | 437/41 |
| 4,701,423 | 10/1987 | Szluk | 437/44 |

FOREIGN PATENT DOCUMENTS

| 0012565 | 1/1979 | Japan . |
| 0158970 | 9/1983 | Japan . |
| 0231864 | 12/1984 | Japan . |
| 0101077 | 5/1986 | Japan . |

OTHER PUBLICATIONS

Bassous et al., "Self-Aligned Polysilicon Gate MOSFETs with Tailored Source and Drain Profiles", IBM Technical Disclosure Bulletin, vol. 22, No. 11, Apr. 1980, pp. 5146–5147.
Wang, "Lithographically Defined Self-Aligned Double-Implanted Doped FET Device", IBM Technical Disclosure Bulletin, vol. 27, No. 8, Jan. 1985, pp. 4629–4631.

Primary Examiner—Brian E. Hearn
Assistant Examiner—M. Wilczewski
Attorney, Agent, or Firm—K. R. Glick

[57] ABSTRACT

A method of making a MOS transistor having source and drain extensions includes forming on a surface of a substrate of single crystalline silicon a gate line having a thin layer of silicon oxide between the gate line and the substrate surface. A light dose of ions of a desired conductivity type are embedded in the substrate surface at each side of the gate line up to the side walls of the gate line. Spacers of thermally grown silicon oxide are formed on the side walls of the gate line and a dose of the ions of the desired conductivity type are embedded into the substrate surface at each side of the gate line to form source and drain regions. The source and drain regions extend up to the spacers and have lightly doped extensions extending up to the side walls of the gate line under the spacers.

5 Claims, 3 Drawing Sheets

METHOD OF MAKING A MOS TRANSISTOR

This is a division of Ser. No. 301,074, filed 1/24/89, now abandoned.

FIELD OF THE INVENTION

The present invention relates to a method of making a MOS transistor, and, more particularly to a method of making a MOS transistor having source and drain extensions.

BACKGROUND OF THE INVENTION

MOS transistors having lightly doped source and drain extensions are generally made by forming on the surface of a substrate of single crystalline silicon a gate line over a thin layer of silicon oxide. The gate line may be made of doped polycrystalline silicon, a refractory metal, or a refractory metal silicide. The surface of the substrate on each side of the gate line is then lightly doped. A layer of silicon oxide is then deposited, generally by a chemical vapor deposition (CVD) technique, over the lightly doped substrate surface on each side of the gate line and over the gate line. The silicon oxide is then anisotropically etched to removed the silicon oxide layer from the surface of the substrate on each side of the gate line, and from the top surface of the gate line, but leaving a layer of the silicon oxide along each side wall of the gate line. The silicon oxide layer along each side wall of the gate line projects over and covers a portion of the lightly doped substrate surface along leach side of the gate line. The exposed surface of the substrate is then more heavily doped to form the source and drain regions of the transistor having lightly doped extension extending under the silicon oxide layer on the side walls of the gate line.

All CVD silicon oxide exhibits large density of electron and hole states. Although the trap density decreases after the CVD oxide is densified, the trap density in any CVD oxide film is orders of magnitude larger that in a thermally grown silicon oxide film. The drain extension region of N-channel (P-channel) MOS transistors is a lightly doped shallow N- (P-) layer. The resistivity of the N- (P-) layer is relatively large. When an electron (hole) is trapped in the spacer oxide layer which is on the side walls of the gate line and over the drain extension, an electron (hole) is repealed away from the N- (P-) region. As the number of trapped electrons (holes) in the spacer oxide layer is increased, the number of mobile electrons (holes) is reduced. The series resistance of this region increases with the number of electrons (holes) trapped in the spacer sidewall. It has been shown that under certain conditions there is a high lateral electrical field at the source end of the channel of a MOS transistor having a lightly doped drain extension. The hot carrier generation rate at this region is very high. Therefore, electrons (holes) can be trapped at the spacer sidewall oxide of both source and drain lightly doped regions. The drain current and the transconductance of the device is, therefore, degraded as the number of electrons (holes) trapped at the spacer sidewall oxide at the source and drain regions of an N-channel (P-channel) MOS transistor is increased. Thus, the trap state in the spacer oxide at the sidewall of the gate line is known to cause the degradation of the performance of the transistor.

SUMMARY OF THE INVENTION

A method of making a MOS transistor having source and drain extensions includes forming on the surface of a substrate of single crystalline silicon a gate line of a conductive material with a layer of an insulating material between the gate line and the substrate surface. A light dose of ions of a desired conductivity type are embedded in the substrate surface at each side of the gate line up to the side walls of the gate line. Silicon at each side of the gate line is then heated in an oxidizing atmosphere to form a spacer layer of thermally grown silicon oxide along each sidewall of the gate line. Then a heavier dose of ions of the desired conductivity type are embedded into the substrate surface at each side of the gate line up to the spacer layers to form the source and drain regions of the transistor. The thermally grown spacer oxide layers on the sidewalls of the gate line have a much lower trap density for electrons or holes so as to improve the operating characteristics of the transistor.

DETAILED DESCRIPTION OF PREFERRED EMBODIMENTS

Figure 1:
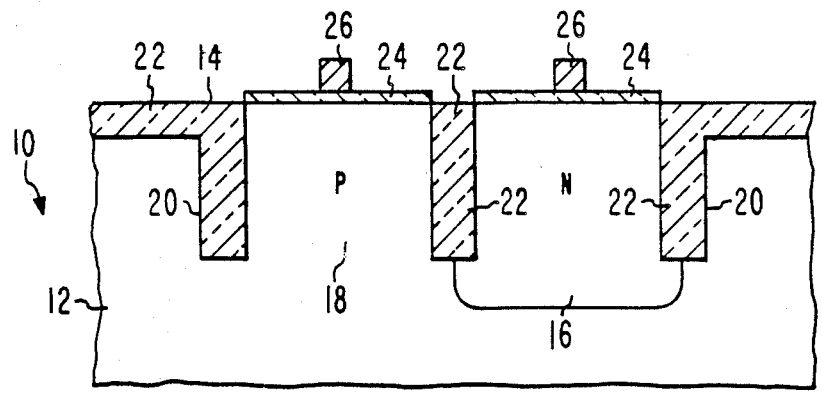
FIGS. 1-4 are sectional views illustrating the steps in sequence of one form of the method of the present invention.

Referring initially to FIGS. 1-4, there is shown a form of the method of the present invention for making MOS transistors in a complementary MOS integrated circuit (CMOS) 10 wherein the gate lines are formed of N+ doped polycrystalline silicon. As shown in FIG. 1, the CMOS device 10 is formed in a substrate 12 of single crystalline silicon of P− type conductivity having a major surface 14. An N type conductivity well 16 is then formed in the substrate 12 at the surface 14. This may be achieved by applying a layer of a photoresist over the substrate surface 14 and, using standard photolithographic techniques, forming an opening in the photoresist layer where the N-well 16 is to be formed. Ions of an N type conductivity modifier, such as phosphorous, are then embedded in the exposed area of the substrate surface 14 and heated to drive them into the substrate 12 and form the N-well 16. Isolation regions are then formed in the substrate 12 along the junctions between the N-well 16 and the P type substrate 12 and to define a P-well 18. As shown, the isolation regions are trenches 20 etched into the substrate 12 from the surface 14 and filled with an insulating material 22, such as silicon oxide. However, other types of isolation can be used instead of the trench isolation regions.

A thin layer 24 of silicon oxide is then formed on the substrate surface 14 over the N-well 16 and P-well 18 by heating the substrate 12 in an oxidizing atmosphere to thermally grow the oxide layer 24 on the substrate surface 14. The silicon oxide layer 24 serves as the channel insulator for the MOS transistors. Gate lines 26 of N+ type polycrystalline silicon are then formed on the silicon oxide layer 24 over the N-well 16 and P-well 18. This may be achieved by depositing by a chemical vapor deposition process a layer of polycrystalline silicon over the entire surface 14 of the substrate 12. The polycrystalline silicon layer is preferably of a thickness of 350 nanometers to 600 nanometers. The polycrystalline silicon layer is then highly doped with a N− type conductivity modifier, such as phosphorous. The polycrystalline silicon layer is then covered with a layer of a photoresist which is defined, using standard photolithographic techniques, to cover only the portions of the polycrystalline silicon layer which are to form the gate lines 26. The uncovered portions of the polycrystalline silicon layer are then removed with a suitable etchant leaving the gate lines 26.

Figure 2:
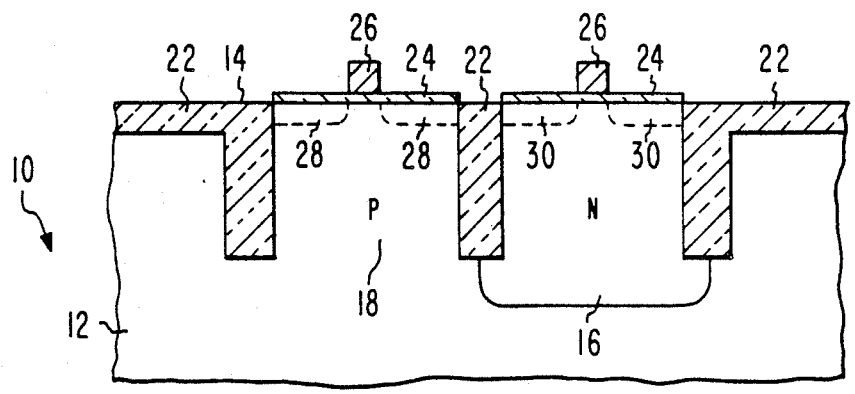

A layer of a photoresist is provided over one of the wells, such as the N-well 16, and a light dose of ions of N− type conductivity are implanted into the P-well 18 at each side of its gate line 26 to form shallow N− type regions 28 in the substrate surface 14 as shown in FIG. 2. The N− type regions 28 may be formed by implanting phosphorous ions at a dose of $1.0 \times 10^{13}$ to $1.0 \times 10^{14}$ per centimeter squared at an energy of 50 keV to 80 keV or arsenic ions at the same dose but at an energy of 80 keV to 170 keV. The photoresist layer is then removed from over the N-well 16 and a photoresist layer is formed over the P-well 18. A light dose of ions of P type conductivity are implanted into the N-well 16 at each side of the gate line 26 to form shallow P− type regions 30 in the N-well 16 at each side of the gate line 26 as shown in FIG. 2. The P- regions 30 may be formed by implanting ions of $BF_2$ at a dose of $1.0 \times 10^{13}$ to $1.0 \times 10^{14}$ ions per centimeter square and at an energy of 50 keV to 120 keV. The depth of both the N- regions 28 and the P- regions 30 should be no deeper than about 0.15 micrometers. The steps described up to this point for making the CMOS device 10 are standard steps used to make such a device.

Figure 3:
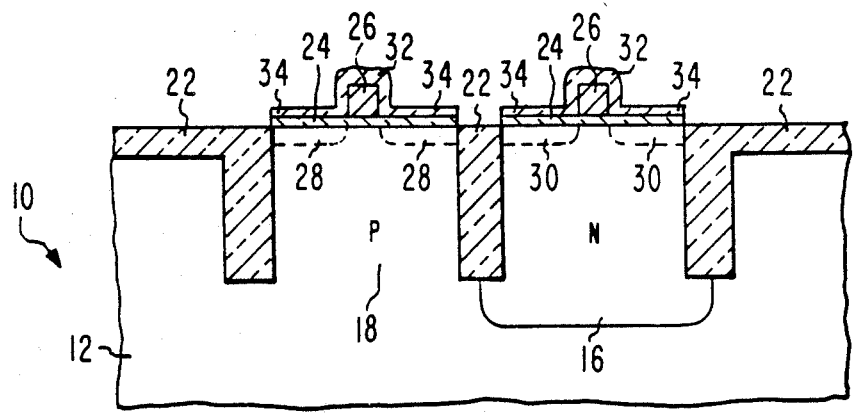

The substrate 12 is now heated at a temperature of from 700° C. to 900° C. in an oxidizing atmosphere, such as steam. This grows a thermal silicon oxide layer 32 of a thickness of 0.1 to 0.2 micrometers on the entire surface of the N+ polycrystalline silicon gate lines 26 as shown in FIG. 3. This also grows a thermal silicon oxide layer 34 on the exposed surface 14 of the substrate 12 on each side of the gate lines 26. However, under these oxidation conditions, the oxidation rate on N+ polycrystalline silicon is three to eight times faster than the oxidation rate of lightly doped silicon. Therefore, the thermal oxide layers 34 on the substrate surface 14 over the lightly doped regions 28 and 30 will only be of a thickness of 20 to 30 nanometers.

Figure 4:
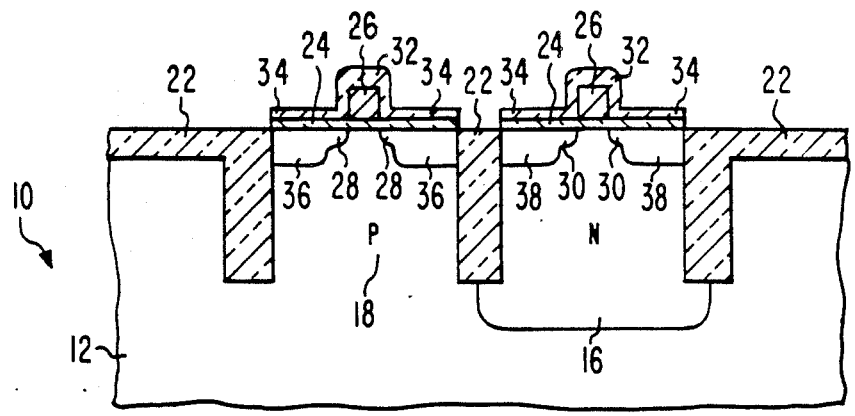

A layer of a photoresist is provided over the portion of the substrate surface 14 over the N-well 16. Ions of a N type conductivity modifier, such as phosphorous or arsenic, are then embedded into the portions of the substrate surface 14 over the P-well 18 on each side of the gate line 26 to form the N+ source and drain regions 36 as shown in FIG. 4. The portions of the thermal oxide layer 32 on the sidewalls of the gate line 26 act as spacers so that the source and drain regions 36 are spaced from the sidewalls of the gate line 26 leaving lightly doped source and drain extensions between the source and drain regions 36 and the channel region under the gate line 26. The photoresist layer over the N-well 16 is removed and a photoresist layer is provided over the substrate surface 14 over the P-well 18. Ions of a P− type conductivity modifier, such as boron, are embedded into the substrate surface 14 over the N-well 16 and on each side of the gate line 26. This forms the P+ type source and drain regions 38 in the N-well 16. The portion of the thermal silicon oxide layer 32 on the sidewalls of the gate line 26 act as spacers so that the source and drain regions 38 are spaced from the sidewalls of the gate line 26 and are thereby provided with lightly doped extensions which extend up to the channel region under the gate line 26. Since the thermal oxide layer 34 on the surface 14 of the substrate 12 are very thin, the ions which are used to form the source and drain regions 36 and 38 can be implanted directly through the thermal oxide layer 34 into the substrate surface 14. The CMOS device 10 is then completed with a protective coating of an insulating material, such as a glass, and with contacts to the source and drain regions and the gate lines using techniques well known in the art.

If the gate lines 26 are made partly or completely of P+ type polycrystalline silicon, a refractory metal or a refractory metal silicide, the form of the method of the present invention described above is not applicable. The oxidation rate of P+ type polycrystalline silicon is no higher than that of lightly doped silicon under all practical oxidation conditions. The oxidation rate of a refractory metal or a refractory metal silicide is even smaller. Therefore, to thermally grow the oxide spacers onto these materials requires excessively long heating times which could adversely affect the device being made. Referring the FIGS. 5–8 there is shown the steps of a form of the method of the present invention for forming thermally grown oxide spacers on gate lines made of P+ type polycrystalline silicon, a refractory metal, or a refractory metal silicide.

A substrate 12 of single crystalline silicon is provided with a N-well 16 and a P-well 18 with isolation regions 22 along the junctions of the wells. A thin silicon oxide layer 24 is thermally grown on the substrate surface 14 over the N-well 16 and P-well 18. A separate gate line 26 is formed over the silicon oxide layer 24 over each of the wells 16 and 18. Lightly doped regions 28 and 30 are formed in the wells 16 and 18 on each side of the gate lines 26. These features may be formed by any technique well known in the art, such as described above with regard to FIGS. 1 and 2 except that the gate lines 26 may be made of either P+ type polycrystalline silicon, a refractory metal or a refractory metal silicide.

Figure 5:
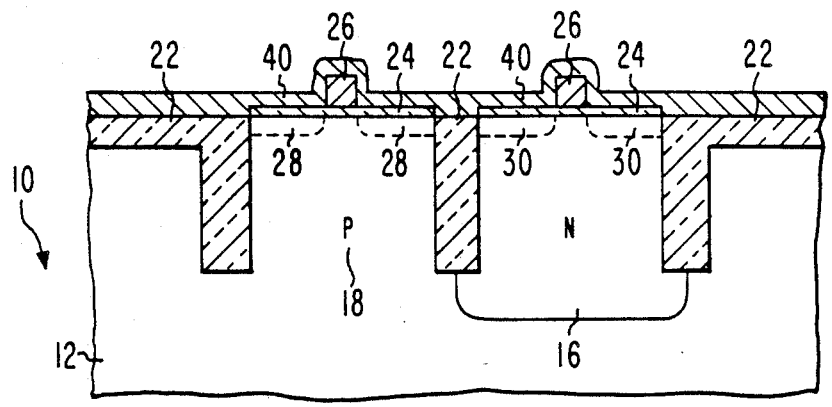
FIGS. 5-8 are sectional views illustrating the steps in sequence of another form of the method of the present invention.
Figure 6:
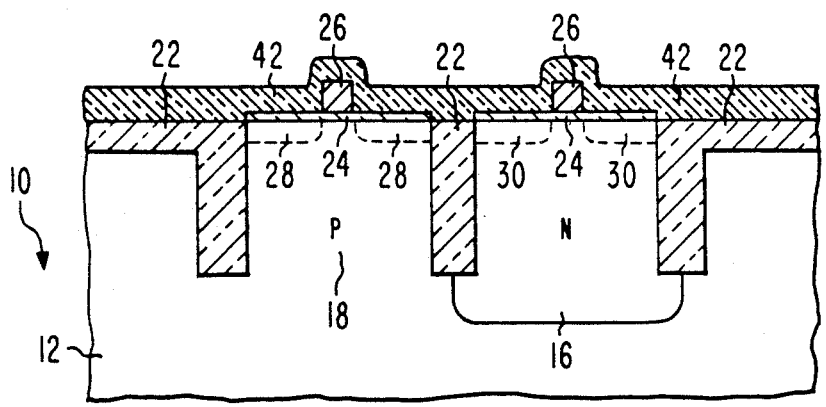

A thin layer 40, 50 to 200 nanometers in thickness, of N+ polycrystalline silicon is deposited onto the substrate surface 14 and over the gate lines 26 as shown in FIG. 5. This may be achieved by a chemical vapor deposition process where the substrate 12 is exposed to a gas of a material containing silicon, such as silane, and heated to a temperature at which the gas decomposes and forms silicon which deposits on the substrate surface 14. The polycrystalline silicon layer 40 may be doped when deposited by including in the deposition gas a material containing the desired dopant, or after the layer is deposited by diffusion or ion implantation. The N+ polycrystalline silicon layer 40 is then heated at 700° C. to 900° C. in an oxidizing atmosphere, such as steam, to thermally oxidize the polycrystalline silicon layer 40 and thereby form a layer 42 of thermally grown silicon oxide as shown in FIG. 6. Although complete conversion of the polycrystalline silicon layer 40 to silicon oxide is desirable, it is not essential since some residual polycrystalline silicon will not degrade the performance of the completed device.

Figure 7:
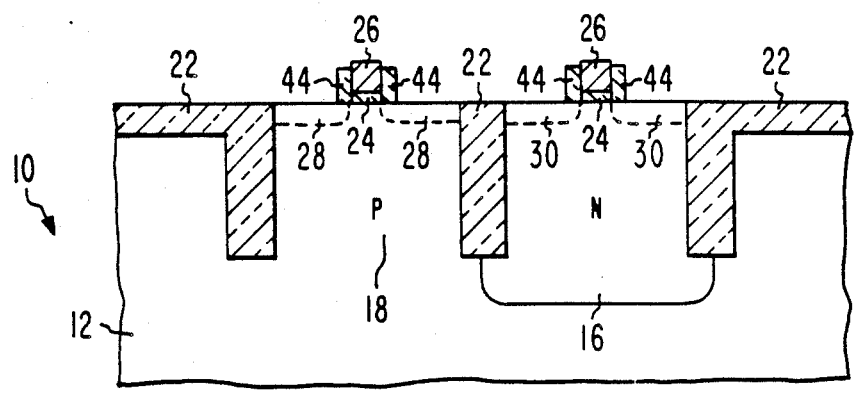
Figure 8:
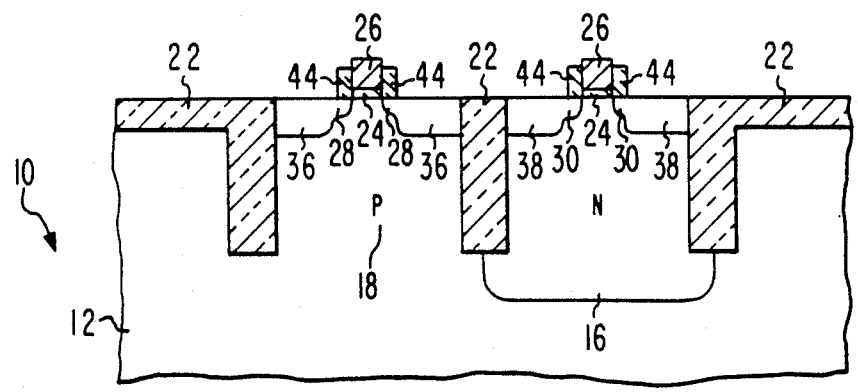

The silicon oxide layer 42 is then subjected to an anisotropic etch in a plasma which etches the silicon oxide layer 42 substantially vertically, i.e. perpendicular to the substrate surface 14. The etch is carried out until all of the silicon oxide layer 42 on the substrate surface 14 at each side of the gate line 26 and on the upper surface of the gate line 26 is removed. However, since the thickness of the portion of the silicon oxide layer 42 along the sidewalls of the gate line 26 in the direction perpendicular to the substrate surface 14 is greater than that of the portions on the substrate surface 14 and the upper surface of the gate line 26, some of the silicon oxide layer will remain along the sidewalls of the gate line as spacers 44 as shown in FIG. 7.

A layer of a photoresist is applied over the substrate surface 14 over the N-well 16, and ions of a N— type conductivity modifier, such as phosphorous or arsenic, are implanted into the P-well 18 on each side of the gate line 26 to form the source and drain regions 36. The spacers 44 cover a portion of the substrate surface 14 adjacent each side of the gate line 26 so that the source and drain regions 36 are spaced from the gate line 26 and provide a more lightly doped extension between the source and drain 36 and the channel region under the gate line 26. The photoresist layer is removed from over the N-well 16 and a photoresist layer is provided over the P-well 18. Ions of a P— type conductivity material, such as boron, are then implanted into the N-well 16 on each side of the gate line 26 to form the source and drain regions 38. The spacers 44 on the sidewalls of the gate line 26 space the source and drain regions 38 from the gate line 26 to provide more lightly doped extensions between the source and drain regions 38 and the channel region under the gate line 26. The CMOS device 10 can then be completed using methods well known in the art.

Thus, there is provided by the present invention a method of making a MOS transistor having source and drain extensions in which the silicon oxide spacers on the sidewalls of the gate line are of thermally grown oxide rather than deposited oxide. This provides a MOS transistor in which the oxide spacers have a much lower density of electron and hole trap states so that the MOS transistor has improved operating characteristics.

We claim:

1. A method of making a MOS transistor having source and drain extensions comprising the steps of:
   forming on the surface of a substrate of single crystalline silicon a gate line of a conductive material with a layer of insulating material between the gate line and the substrate surface;
   implanting a light dose of ions of a desired conductivity type into the surface of the substrate at each side of the gate line up to the side walls of the gate line;
   providing a layer of polycrystalline silicon over the substrate surface on each side of the gate line and over the gate line;
   heating the polycrystalline silicon layer in an oxidizing atmosphere to convert substantially the entire polycrystalline silicon layer to thermally grown silicon oxide;
   removing the portions of the thermally grown silicon oxide on the substrate surface at each side of the gate line leaving spacers on the side walls of the gate line; and
   implanting a heavier dose of the ions into the substrate surface at each side of the gate line up to the spacers to form the source and drains of the transistors.

2. A method in accordance with claim 1 in which the layer of polycrystalline silicon is a layer of N+ type conductivity.

3. A method in accordance with claim 2 in which the portion of the thermally grown silicon oxide layer on the upper surface of the gate line is also removed.

4. A method in accordance with claim 3 in which the portions of the thermally grown silicon oxide layer on the substrate surface at each side of the gate line and over the upper surface of the gate line are removed by an anisotropic etch in a plasma.

5. A method in accordance with claim 4 in which the gate line is a conductive material selected from the group consisting of P+ type polycrystalline silicon, a refractory metal and a refractory metal silicide.

* * * * *